Feb. 23, 1960 R. C. CARLSON 2,926,291

TUNABLE CONDENSER

Filed July 13, 1956

INVENTOR.
Reuben C. Carlson
BY
J. D. Douglas
His ATTORNEY 2,926,291

TUNABLE CONDENSER

Reuben C. Carlson, River Grove, Ill., assignor to Admiral Corporation, Chicago, Ill., a corporation of Delaware Application July 13, 1956, Serial No. 597,785

4 Claims. (Cl. 317—249)

This invention relates generally to a tunable condenser, and particularly to such a condenser especially adapted for use in a television tuner as used in a television receiver for fine tuning.

The various types of tuning condensers used heretofore on television and radio receivers having been characterized generally by relatively expensive constructions which do not lend themselves, as much as desired, to manufacture and assembly on a mass production basis. In addition, many such prior tuning condensers are so constructed as to be susceptible of being rendered defective in operation when a careless user displaces axially the rotatable tuning shaft by which the condenser is tuned. Furthermore, many such condensers are made inoperative when the user forcibly turns the tuning shaft too far in either direction.

The present invention is concerned with a novel tunable condenser which avoids the foregoing disadvantages and which is particularly adapted for low-cost assembly in television receivers manufactured on a mass production basis.

Accordingly, it is a general object of the present invention to provide a novel and improved tunable condenser.

It is also an object of the present invention to provide a novel tunable condenser of inexpensive construction which is particularly well suited for use in a television receiver for fine tuning.

Another object of this invention is to provide such a tunable condenser whose operation is not affected when a careless user displaces axially the rotatable tuning shaft for the condenser.

Also, it is an object of this invention to provide such a tunable condenser which will withstand turning of the tuning shaft too far in either direction.

A further object of this invention is to provide a novel tunable condenser of simplified, inexpensive and rugged construction which lends itself to assembly in television receivers on a mass production basis.

Other and further objects and advantages of the present invention will be apparent from the following description of a preferred embodiment of the invention, which is illustrated in the accompanying drawing.

Figure 1:
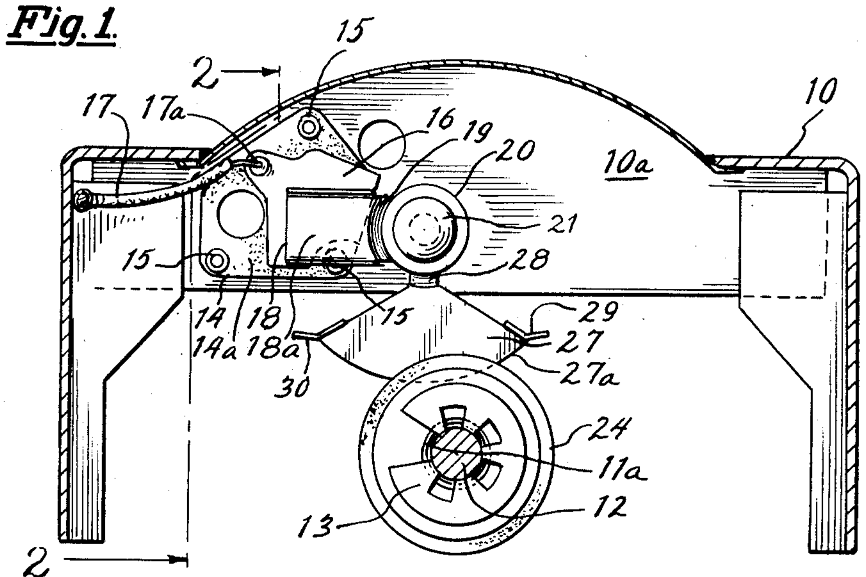
Figure 1 is a plan view of the present condenser, taken from inside the tuner housing in the television receiver of which the condenser forms a part.
Figures 2, 3, 4:
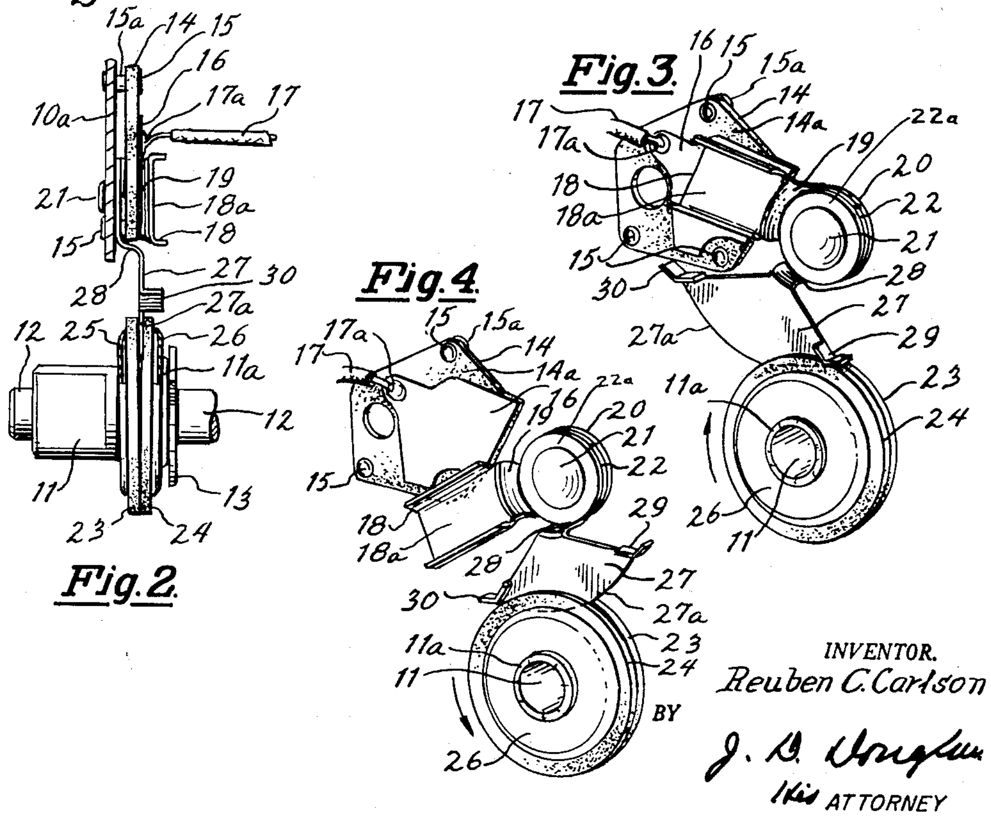
Figure 2 is a view taken along the section line 2—2 in Fig. 1.
Figure 3 is a perspective view showing the condenser in one limit of its adjustment.
Figure 4 is a similar view showing the condenser in its opposite limit of adjustment.

Referring to Figs. 1 and 2, there is provided a metal chassis 10 disposed inside the cabinet of a television receiver and providing a bearing support for the hollow tuning shaft 11 for the present condenser. Shaft 11 is coaxially mounted on a rotatable channel selector shaft

12 in the usual manner such that either of these shafts can be rotated with respect to the other. A snap ring 13 (Fig. 2) is located in an annular groove in shaft 12 next to the inner end 11a of the fine tuning shaft 11 so as to limit the axial movement of shaft 11 inwardly along shaft 12. A similar arrangement is provided adjacent the outer ends of these shafts, so that the fine tuning shaft 11 has only limited play axially along the channel selector shaft 12.

A rigid flat insulation support plate 14 is secured to the end wall 10a by spaced rivets 15, which extend through annular insulation washers 15a which serve to space the support plate 14 from the inner face of the chassis end wall 10a, as best seen in Fig. 2. The support plate 14 in one practical embodiment may be made of a laminated phenolic condensation product. It presents a flat inner face 14a which extends parallel to the chassis end wall 10a and perpendicular to the axis of the tuning shaft 11. A metal foil electrode 16 is bonded to this face of the insulation support and extends across a substantial portion of this face, as best seen in Figs. 1, 3, and 4. Desirably this foil electrode may be provided on the insulation support plate by the etched-foil technique of making printed circuits. A lead-in wire 17 is soldered at 17a to the foil electrode 16. The foil electrode serves as the fixed condenser plate in the present condenser.

The adjustable plate in the present condenser is in the form of plate 18 which is channel-shaped in cross-section, as best seen in Fig. 2. Plate 18 presents a flat wall 18a which extends parallel to the flat inner face 14a on the insulation support 14 and which is disposed a slight distance inwardly from the foil electrode 16 on the insulation support. At one end the plate 18 terminates in a portion 19 bent outward at a right angle and connected to a flat annular hub portion 20. The hub portion 20 is pivotally supported by a shouldered rivet 21 which extends through the chassis end wall 10a and which provides a turning axis for the hub portion 20 parallel to the axis of the tuning shaft 11. By means of a spring washer 22 which engages the inner face of the hub portion 20 and a flat washer 22a engaging the inner face of the spring washer, the hub portion is pressed toward the inner face of the chassis end wall 10a, so that the outer face of this hub portion is in continuous rubbing engagement with this end wall chassis but capable of turning about rivet 21 without excessive frictional drag. By virtue of this arrangement the adjustable condenser plate 18 is continuously grounded to the chassis 10.

At the inner side of the chassis end wall 10a the tuning shaft 11 carries a pair of flat circular insulation discs 23, 24, which desirably may be of the same material as the support plate 14. These discs are secured on shaft 11 by means of dished spring washers 25 and 26, respectively, which press the insulation discs together with their flat confronting faces abutting against one another.

A follower 27, which has an arcuate peripheral edge 27a, has its peripheral segment adjacent this edge gripped frictionally between the discs 23 and 24 at one side of shaft 11 (toward rivet 21). The spring washers 25, 26 permit the insulation discs to receive this segment of follower 27 snugly between them. The follower 27 is of progressively reduced size away from its peripheral edge 27a and terminates in a reduced neck portion 28, which is bent over outwardly at a right angle and connected to the hub portion 20 in spaced relation to the connection of plate 18 thereto. The follower 27 between its peripheral segment engaged by the discs 23, 24 and its connection to the hub portion 20 is flexible in the direction of the axis of tuning shaft 11.

Preferably the hub portion 20, the plate 18 and the follower 27 are formed as an integral sheet metal stamping.

With this arrangement, when the tuning shaft 11 is turned the discs 23 and 24 turn as a unit with it. By their frictional engagement with the follower 27 the discs cause the follower 27, hub portion 20 and plate 18 to turn as a unit about the pivot provided by rivet 21 in the opposite direction to the turning movement of shaft 11. Accordingly, the plate 18 may be positioned in closely spaced, parallel, confronting, capacitative relationship to a selected portion of the foil electrode 16 on the insulation support 14.

At either end of its peripheral edge 27*a* the follower 27 is formed with integral transversely protruding ears 29 and 30, which respectively are positioned to engage the side edge of disc 24 to define the extreme limits of turning movement of the follower.

In the extreme clockwise position of the follower 27 as illustrated in the drawing, the adjustable condenser plate has substantially its entire flat face 18*a* in confronting, capacitative relationship to the fixedly positioned foil electrode 16 (Fig. 3). In this position the protrusion 29 on follower 27 engages the side edge of disc 24 to positively prevent the follower from being turned farther in the clockwise direction. Also, the other protrusion 30 on the follower engages the edge of the insulation support plate 14, so that further clockwise movement of the follower is doubly prevented. If at this time the tuning shaft 11 is turned farther counterclockwise, the discs 23 and 24 simply slip frictionally over the follower 27 without disengaging from it, due to the restraining effects of the protrusions 29 and 30 on the follower.

In the extreme counterclockwise position of the follower 27 (Fig. 4), the condenser plate 18 has its flat face 18*a* substantially completely out of confronting relationship to the foil electrode 16. In this position of the parts the protrusion 30 on follower 27 engages the side edge of disc 24 to positively prevent further turning of the follower counterclockwise, even if shaft 11 is continued to be turned clockwise. The protrusion 30 retains the follower 27 frictionally engaged between the discs 23 and 24 even if shaft 11 is continued to be turned clockwise, in which event the discs slip frictionally over the follower.

If a careless user should force the tuning shaft 11 axially inward, the follower 27 will flex in the same direction and be retained between the discs 23 and 24 carried by the shaft, so that the operative relationship between these discs and the follower remains essentially unchanged. The spring washers 25, 26 engaging the friction discs 23, 24 permit such flexing of the follower to take place but continue to press the discs together so that the parts return to their proper positions when the axial force on the tuning shaft is removed. Such axial flexing of the follower 27 does not cause any displacement of the movable plate 18 because follower 27 and plate 18 are rigidly connected to the hub portion 20 substantially independently of one another. Accordingly, the plate 18 retains its same spacing with respect to the fixed foil electrode 16 and the capacitative relationship between these plates of the condenser remains unchanged even if such careless operation of the tuning shaft should occur.

From the foregoing it will be apparent that the illustrated embodiment of this invention provides a simplified construction which is well suited for economical manufacture and assembly in television receivers on a mass production basis and which is capable of withstanding the rough use to which television receiver tuners are subjected by careless users.

It is to be understood that while there has been described herein and illustrated in the accompanying drawing a presently preferred embodiment of this invention, various modifications, omissions and refinements which depart from the structural details of the disclosed embodiment may be adopted without departing from the spirit and scope of this invention.

I claim:

1. An adjustable condenser comprising a fixedly positioned insulation support presenting a flat face, a metal foil electrode bonded to said face and extending thereacross, a rotatable tuning shaft extending perpendicular to said flat face of the insulation support in spaced relation to the insulation support, a pair of friction discs carried by said shaft to turn therewith and having contiguous faces, a follower mounted for rotation about an axis extending parallel to said shaft and spaced therefrom, said follower having a peripheral segment gripped frictionally between said discs to be turned about said axis in response to turning of the shaft, said follower between its pivotal support and its peripheral segment being flexible in the direction of the axis of said shaft to be retained between said friction discs upon axial displacement of the shaft, said follower at each end of its peripheral segment having transverse protrusions for engagement respectively with a side edge of one of the friction discs to limit the turning movement of the follower in either direction, said follower having a bent over reduced neck portion away from its peripheral segment, a flat annular hub portion connected to said reduced neck portion and extending around said axis of rotation, a metal condenser plate connected rigidly through a bent over portion to said hub portion in spaced relation to the follower so as to turn as a unit with the follower, said condenser plate and its bent over portion being substantially inflexible upon flexing of said follower when the shaft is displaced axially, said condenser plate having a flat face which extends perpendicular to said axis of rotation and positioned to be in closely spaced, confronting, selective capacitative relationship to said foil electrode on the insulation support depending upon the angular position of the follower.

2. The condenser of claim 1, wherein said follower, said hub portion, said condenser plate and said bent over portions are in the form of an integral stamped sheet metal member.

3. The condenser of claim 2, wherein one of said transverse protrusions on said follower is positioned to engage said insulation support to limit the turning movement of the follower in one direction.

4. An adjustable condenser comprising a fixed electrode, a rotatable tuning shaft extending perpendicular to said fixed electrode in spaced relation thereto, a pair of friction discs carried by said shaft to turn therewith and having contiguous faces, a follower mounted for rotation about an axis extending parallel to said shaft and spaced therefrom, said follower having a peripheral segment gripped frictionally between said discs to be turned about said axis in response to turning of the shaft, said follower between its pivotal support and its peripheral segment being flexible in the direction of the axis of said shaft to be retained between said friction discs upon axial displacement of the shaft, said follower having a bent over reduced neck portion away from its peripheral segment, a flat annular hub portion connected integrally to said reduced neck portion and extending around said axis of rotation, a metal condenser plate connected integrally through a bent over portion to said hub portion in spaced relation to the follower so as to turn as a unit with the follower, said follower, hub portion and condenser plate being in the form of an integral sheet metal stamping, said condenser plate and its bent over portion being substantially inflexible upon flexing of said follower when the shaft is displaced axially, said condenser plate having a flat face which extends perpendicular to said axis of rotation and positioned to be in closely spaced, confronting, selective capacitative relationship to said fixed electrode depending upon the angular position of the follower.

(References on following page)

References Cited in the file of this patent

UNITED STATES PATENTS

| | | |
|---|---|---|
| 1,577,613 | Dunmore | Mar. 23, 1926 |
| 1,684,461 | Van Deventer | Sept. 18, 1928 |
| 2,591,705 | Kodama | Apr. 8, 1952 |
| 2,614,171 | Fein | Oct. 14, 1952 |
| 2,745,993 | Foster | May 15, 1956 |
| 2,791,124 | Gossard | May 7, 1957 |

FOREIGN PATENTS

| | | |
|---|---|---|
| 252,829 | Great Britain | June 10, 1926 |
| 622,297 | France | Feb. 26, 1927 |